United States Patent
Fukui et al.

(10) Patent No.: US 6,191,571 B1
(45) Date of Patent: *Feb. 20, 2001

(54) MEASURING METHOD BY SPECTRUM ANALYZER

(75) Inventors: Takayoshi Fukui; Kouichi Yamashita; Takahiro Yamaguchi, all of Gyoda; Osamu Aoyama, Iwaki; Takashi Kosuge, Kumagaya; Yoshiaki Miyamae, Saitama; Toshiharu Kasahara, Gyoda; Hiroaki Takaoku, Kumagaya, all of (JP)

(73) Assignee: Advantest Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/248,110

(22) Filed: Feb. 11, 1999

Related U.S. Application Data

(62) Division of application No. 08/707,032, filed on Sep. 3, 1996.

(30) Foreign Application Priority Data

Sep. 8, 1995 (JP) .................................................. 7-231662
Sep. 8, 1995 (JP) .................................................. 7-231678
Sep. 8, 1995 (JP) .................................................. 7-231691

(51) Int. Cl.[7] ......................... G01R 13/20; G01R 13/24; G01R 13/02; G01R 13/00; G01R 23/14
(52) U.S. Cl. ......................... 324/76.26; 324/76.23; 324/76.27; 324/614; 702/66; 702/67; 702/76
(58) Field of Search .............................. 324/76.26, 76.23, 324/76.27, 614; 702/66, 67, 69, 74, 76, 72; 455/67.3

(56) References Cited

U.S. PATENT DOCUMENTS

| | | | |
|---|---|---|---|
| 3,182,254 | 5/1965 | Feldman | 324/76.26 |
| 4,578,638 | 3/1986 | Takano | 324/76.23 |
| 4,607,215 | 8/1986 | Takano | 324/76.23 |

(List continued on next page.)

FOREIGN PATENT DOCUMENTS 31 40 073 A1    4/1982   (DE).
40 08 143 C2    9/1990   (DE).

OTHER PUBLICATIONS

HP Catalog, (No Month Available) 1992, HP35665A Analyzer (p. 224) (1 Page).
American Heritage Dictionary (No Month Available 1990)—definition for "waveform".
Hale & Weibel: "A Low–Frequency Spectrum Analyzer that Makes Slow Sweeps Practical"—HP Journal, Sep. 1973.
Modern Spectrum Analyzer Theory and Applications (Morris Engelson, Artech House, Inc., 1984, pp. 10–13, and 154–155).

(List continued on next page.)

Primary Examiner—Safet Metjahic
Assistant Examiner—Anjan K Deb
(74) Attorney, Agent, or Firm—Staas & Halsey LLP

(57) ABSTRACT

A measuring device and method use a spectrum analyzer. The spectrum analyzer comprises a display screen controlled by a processor on which a spectrum of an input signal is displayed in a frequency region on a half portion of the display screen and a noise level at a frequency associated with the input signal is displayed in a time region on another half portion of the display screen.

2 Claims, 8 Drawing Sheets

U.S. PATENT DOCUMENTS

| | | | |
|---|---|---|---|
| 4,620,147 | 10/1986 | Niki | 324/76.23 |
| 4,839,582 | 6/1989 | Fukaya | 324/76.23 |
| 5,075,618 | 12/1991 | Katayama | 324/76.27 |

OTHER PUBLICATIONS

Signals Systems (Athanasios Papoulis, 1977, Japanese translation, McGraw–Hill and UNI Agency, Inc., Tokyo, pp. 102–109).

Spectrum and Network Measurements (Robert A. White, Hewlett–Packard Company, Prentice Hall, Englewood Cliffs, New Jersey 07632, 1991, pp. 46, 47, 74, and 75).

U.S. application No. 08/707,032, Fukui et al., filed Sep. 3, 1996.

U.S. application No. 09/528,720, Fukui et al., filed Mar. 20, 2000.

MEASURING METHOD BY SPECTRUM ANALYZER

This application is a Divisional of application Ser. No. 08/707,032, filed Sep. 3, 1996, now pending.

BACKGROUND OF THE INVENTION

The present invention relates to a method for measuring an S/N (signal to noise ratio), a C/N (carrier wave level to specific frequency noise level), a third order distortion and a fifth order distortion in an input signal etc. using a spectrum analyzer.

FIG. 1 shows a general configuration example of a spectrum analyzer. An output signal of an object 11 is inputted to a spectrum analyzer 15 as an input signal. In the spectrum analyzer 15, an input signal is supplied to a frequency mixer 17 via an input variable attenuator 16 and then the frequency of the input signal is mixed with the frequency of a local signal from a frequency sweep generator 18. Then the mixed output is supplied to a band pass filter 19 and the output of the filter 19 is amplified by an amplifier 21 and then the frequency of the amplified output is mixed with the frequency of a local signal from a local oscillator 23 by a frequency mixer 22. And then, the intermediate frequency signal is taken out by a band pass filter 24 and the output of the filter 24 is detected by a detector 26. The detected output is converted into a digital signal by an A/D converter 28 after passing through a low pass filter 27 and is stored in a buffer memory 29. A control part 31 is a so called CPU and performs a setting of attenuation amount for the attenuator 16 in accordance with a parameter set by parameter setting means 32, a control of the frequency sweep generator 18 by controlling a ramp voltage generator 34 through a timing controller 33. That is, the control part 31 (CPU) performs a setting of a sweep frequency band, a setting of a band width RBW for each of the filters 19 and 24, a setting of a band width VBW for the filter 27 and a setting of a sampling period for the AND converter 28, as well as a display control of the data stored in the buffer memory 29 on a display unit 35.

In a conventional system, for example when a C/N of a continuous wave input signal is measured, a carrier wave frequency of a signal to be measured and a noise frequency $f_N$ (is usually prescribed in accordance with, for example, a modulation mode of an input signal) whose noise level is to be measured against the signal are set by the parameter setting means 32. Then data are taken out from the memory 29 and are displayed on the screen of the display unit 35 as shown in, for example, FIG. 2A. In addition, a ratio $L_C/L_N$ of a carrier wave frequency data (level) $L_C$ to a data (level) $L_N$ of the noise frequency is displayed on a part of the screen like, for example, C/N−53 dBc/Hz. In this case, since the noise level $L_N$ changes at random, the band width VBW of the low pass filter 27 is usually set to relatively narrow band, i.e., to a level of 1/10 of the band width RBW of the band pass filters 19 and 24 so that the measured noise levels are averaged.

In the case where a C/N of an input signal is measured using this spectrum analyzer, the following operations are performed in conventional system.

1. A central frequency is set by pushing a frequency button.

2. A frequency interval (an offset value) between a signal to be measured (a carrier wave) and a noise is set.

3. A frequency span (a frequency interval to be displayed on a display screen) is set by pushing a frequency span button.

4. A peak of the carrier wave is coincided with the central frequency of the screen (FIG. 2A).

5. The carrier wave level is coincided with a reference level.

6. A marker is put on a peak point of the signal through a peak search process.

7. A delta marker is used as a marker.

8. The delta marker 38 is coincided with the noise frequency to be measured (FIG. 2A).

9. A noise measurement is selected.

10. An indicated value of a noise level is read.

In these operations, when a frequency span is set, a band width RBW (usually, the settable width is predetermined) of the band pass filters 19 and 24 is set by trial and error so that the wave forms of the signal portion and the noise portion are accurately displayed.

When a intermodulation distortion is measured by a spectrum analyzer 15, as indicated by a dashed line in FIG. 1, test signals of the same amplitude having frequencies $f_1$ and $f_2$ from signal generators 12 and 13 respectively are combined by a power combiner 14 and are supplied to the object 11, and then a intermodulation distortion generated by the object 11 is measured.

Formerly, the measurement of a intermodulation distortion has been performed in the following sequence.

1. A central frequency is set to the frequency of one of the input signals, namely, the frequency of one of the two fundamental waves on which a mutual modulation distortion is based, i.e., a signal having a frequency $f_1$ and a signal having a frequency $f_2$ 2. An input signal frequency range, i.e., a displayed frequency range is manually set by pushing a span button.

3. A resolution band width is set by pushing a band width button. That is, the setting of each band width RBW of the band pass filters 19 and 24 is switched from an automatic operation to a manual operation, and then a resolution band width RBW is set. The reason for the manual operation is that when a resolution band width RBW is automatically set, a spectrum of a intermodulation distortion is hidden at the bottom portion of the input signal due to a low level of a intermodulation distortion or an influence of the band pass filters 19 and 24. In such a case, a spectrum of a intermodulation distortion may not be observed.

4. A third order distortion is measured by pushing a TOI button.

5. The above operations 1–3 are repeated by changing the setting of the resolution band width RBW until four clear peaks appear on the display screen, i.e., as shown, for example, in FIG. 2B, until four clear peaks, the spectrums 41 and 42 of two input signals (fundamental waves) having frequencies $f_1$ and $f_2$ respectively, a third order distortion 43 of a frequency $(2f_1-f_2)$ generated by a intermodulation of these two input signals and a third order distortion 44 of a frequency $(2f_2-f_1)$ appear on the display screen.

Incidentally, when a level of the fundamental waves 41 and 42 at the input side of the input attenuator 16 is L as shown in FIG. 3A and a level difference between the third order distortions 43, 44 and the respective fundamental waves 41, 42 is $\Delta L$, a distortion amount (level) of the third order distortions 43 and 44 is $L-\Delta L$. When an attenuation amount in the input attenuator 16 is ATT, as shown in FIG. 3B, the level of the fundamental waves 41 and 42 at the output side of the input attenuator 16 is $L-ATT$ and the level of the third order distortions 43 and 44 is $L-(\Delta L+ATT)$. In a spectrum analyzer 15, it is clearly stated in the specifications that when a fundamental wave having a level of X dBm is inputted to the mixer 17, a third order distortion of (X−Y) dBm is generated. From a generation characteristic (a generation principle) of a third order distortion, when the input fundamental wave level is X+ΔX, the third order distortion level is Y+ΔY, where ΔY=3ΔX. That is, a third order distortion generated in the mixer 17 is increased by three times of the input fundamental wave level increment ΔX, i.e., 3ΔX.

Therefore, when the fundamental wave level is attenuated by ΔATT in the input attenuator 16, each of the third order distortions is decreased by ΔATT. However, the third order distortion generated in the mixer 17 is decreased by 3ΔATT. From such a relationship, when the attenuation amount of the input attenuator 16 is large, the third order distortion generated in the mixer 17 is greatly reduced to be neglected. The input/output characteristic of the mixer 17 for the fundamental waves 41 and 42 is indicated by a linear line 45. When the level of the fundamental waves 41 and 42 is small and the third order distortion generated in the mixer 17 is in the range to be neglected, the input/output characteristic of the mixer 17 for the third order distortions 43 and 44 inputted to the mixer 17 is indicated by a linear line 46 whose level is lower by ΔL than the characteristic line 45 of the fundamental waves 41 and 42. However, when the level of the fundamental waves 41 and 42 is large to some extent, the third order distortion generated in the mixer 17 cannot be neglected and the characteristic of the third order distortion generated in the mixer 17 is indicated by a linear line 47. The third order distortion appearing at the output of the mixer 17 is a sum of an input third order distortion and a third order distortion generated in a mixer. That is, the sum is represented by;

$$10^{(L(\Delta^{L+ATT}))/10} + JO^{L/10}$$

As mentioned above, since the third order distortion is represented by a sum of exponential functions, when the input level of the fundamental waves 41 and 42 is smaller than an intersecting point 48 of the linear lines 46 and 47, the level of the input third order distortions 43 and 44 becomes dominant and when the input level of the fundamental waves 41 and 42 is larger than the intersecting point 48, the third order distortion generated in the mixer becomes dominant. That is, in FIG. 4A, the level of the third order distortions 43 and 44 from the object 11 is dominant in the input level range $W_1$ while the level of the third order distortion generated in the mixer 17 is dominant in the input level range $W_2$ whose input level is larger than the input level in the range $W_1$.

Therefore, in the state where no influence by the third order distortion generated in the mixer 17 exists by making the attenuation amount of the attenuator 16 of the spectrum analyzer large, the third order distortion generated by the object 11 against the fundamental wave level can be known by measuring the fundamental wave level and the third order distortion.

Further, from the above relationship, an intercept point can be obtained as described below. When the gain of the object 11 is assumed to be 1, the input/output level characteristic for the fundamental waves is indicated by a linear line 45a in FIG. 4B. On the other hand, the characteristic of the third order distortion generated by the object 11 against the fundamental waves is indicated by a linear line 46a. When an input level of an fundamental wave is $l_P$ and the output level is $l_{O1}$, the linear line 45a is represented by $l_{O1}=l_P$. When a third order distortion level is $l_{O3}$, the linear line 46a is represented by $l_{O3}=3l_P+a$. When, in the spectrum analyzer 15, an internal intermodulation, i.e., a fundamental wave level $l_P=l_{O1}$ is measured in the range where the third order distortion generated in the mixer 17 can be neglected and an input third order distortion level $l_{O3}$ is measured, and then $l_P$ and $l_{O3}$ are substituted in the equation of the linear line 46a, a value of the constant a can be obtained. The intersecting point 49 of the lines 45a and 46a is usually called an "intercept point" and the coordinate of the intercept point is given by $(l_{p1}+\Delta L/2, l_{o1}+\Delta L/2)$, where ΔL is given by $\Delta L=l_{o1}-l_{o3}$, and $l_{p1}$ and $l_{o1}$ denote values of $l_p$ and $l_o$ at $l_{o3}=0$, and it holds that $l_{o1}=l_{p1}$. Incidentally, the larger the coordinate value of the intercept point is, the smaller the generated third order distortion in the object 11 is. Thus, the input level range to the object 11 can be made wider.

In such a way, in a conventional system, the attenuation amount of the input attenuator is manually changed to judge if there is an influence of a intermodulation by a frequency mixer in a spectrum analyzer and a intermodulation distortion is measured. And thus, a intermodulation distortion cannot be automatically measured.

That is, an input attenuator 16 is for making an input signal to be a desired level range and a usual spectrum analyzer is arranged such that the attenuation amount of the input attenuator can be changed in 10 dB steps. Such a magnitude of a step change is enough for the usual spectrum analyzer. In a conventional system, if a third order distortion level is not changed when an attenuation amount of the attenuator 16 is changed by 10 dB, the level is used as a level of the input third order distortions 43 and 44. Then, a difference from an input fundamental wave level is judged as a level difference ΔL between an input fundamental wave and an input third order distortion. When, in such a way, an attenuation amount is changed in 10 dB steps, only one or two measuring points which are not influenced by an internal third order distortion (a third order distortion of a mixer) are available. Further, it is difficult to make sure that these measuring points are really not influenced by an internal third order distortion, and thus a third order distortion level may not sometimes be accurately measured.

In addition, a resolution band width, i.e., a change of band width of each of the band pass filters 19 and 24 is set manually. Further, this setting and a setting of an input attenuation amount are performed in trial and error. Since these band width setting and attenuation amount setting influence each other in displaying spectrums, it is very hard to set a proper resolution band width RBW.

Further, in a conventional system, in order to know a noise level as accurately as possible, a band width VBW of the low pass filter 27 is set to a small value. On the other hand, the measuring time, i.e., the frequency sweeping time $T_s$ can be represented by the following formula when a frequency span (a frequency interval for measurement) is $S_{pan}$ (Hz).

$$T_s = S_{pan}(Hz)/\{RBW(Hz) \times min(RBW, VBW)(Hz) \times 0.5\}(sec) \quad (1)$$

In this case, min(RBW, VBW) indicates smaller one of RBW and VBW. As mentioned above, since VBW is set to a degree of VBW =RBW/10, the measuring time $T_s$ is $T_s=10 \times S_{pan}/\{(RBW)^2 \times 0.5\}$ (sec). Therefore, there is a problem that the measuring time is relatively long.

Further, since a spectrum is displayed as shown in FIG. 2A, a noise is displayed at one frequency point $f_N$. Although the noise level fluctuates up and down, the noise level is displayed as an approximately constant level due to an integral by the low pass filter 27 and a display integral effect by the display unit 35. Therefore, the noise level changing at random cannot be known.

In a measurement using a spectrum analyzer, when a wave form is displayed in a frequency region, RBW is usually set in trial and error.

Parameters other than RBW, i.e., a band width VBW of the low pass filter 27, a central frequency on a display screen and a frequency range (a frequency span) to be displayed on the display screen are also set manually. In such a way, in a conventional system, various parameters in the spectrum analyzer are set manually. Particularly, a band width RBW by which the resolution is determined is set by setting various parameters in trial and error. Therefore, it takes relatively a long time for the setting and the operation is troublesome. In addition, in a conventional system, an S/N has not been measured by a spectrum analyzer and therefore, an S/N measurement has been desired.

SUMMARY OF THE INVENTION

It is an object of the present invention to provide a measuring method by a spectrum analyzer for automatically setting parameters such as a passing band width etc. to proper values.

It is another object of the present invention to provide a measuring method by a spectrum analyzer wherein a noise measurement can be performed in a relatively short time and accurately.

In is a further object of the present invention to provide a measuring method by a spectrum analyzer wherein a inter-modulation distortion can be measured automatically.

According to a first aspect of the present invention, an RBW is determined from a frequency interval of a displayed wave form of an input signal and is set in a band pass filter such that a relational characteristic between a frequency interval of a wave form to be displayed and a dynamic range of a noise level or an input signal is satisfied, the relational characteristic having parameters of passing band widths RBW of a band pass filter for taking out a frequency converted signal in a spectrum analyzer.

A band width VBW of a low pass filter to which an output of a detector in the spectrum analyzer is supplied is set to one tenth of the determined RBW.

In an S/N measurement, an interval between a central frequency of a signal portion and one end frequency of a noise portion is defined as a frequency interval of a displayed wave form. In a C/N measurement, an interval between a carrier wave frequency of an input signal and a noise frequency to be measured is defined as a frequency interval of a displayed wave form. In a intermodulation distortion measurement, an interval between a fundamental wave frequency and a frequency of a intermodulation wave adjacent to the fundamental wave frequency is defined as a frequency interval of a displayed wave form.

According to a second aspect of the present invention, a spectrum wave form of an input signal is displayed on a half portion of a display screen and noise levels at a frequency associated with the input signal are displayed on the other half portion of the screen in a time region.

In this case, the band width VBW of the low pass filter is set nearly equal to the band width RBW of the band pass filter.

According to a third aspect of the present invention, an input attenuation amount is increased by a predetermined value and a intermodulation distortion at that time is measured (first step). Then, an input attenuation amount is changed by an infinitesimal value smaller enough than the predetermined value and a intermodulation distortion at that time is measured (second step). Then, a difference amount between the measured intermodulation distortion in the second step and the measured intermodulation distortion in the first step is obtained (third step). Then, the first step through the third step are repeated until the difference amount becomes equal to or smaller than a predetermined value (fourth step), and when the difference amount becomes equal to or smaller than the predetermined value, the measured intermodulation distortion at that time is determined as a intermodulation distortion in an input signal (fifth step).

A fundamental wave level at the time when the intermodulation distortion is obtained is measured (sixth step). Then, an intersecting point of a intermodulation distortion changing characteristic linear line which passes the point of intermodulation distortion obtained in the fifth step and is based on a fundamental wave level change, and a fundamental wave output level changing characteristic linear line which passes the point of the fundamental wave level obtained in the sixth step and is based on a fundamental wave level change is obtained. And then this intersecting point is determined as an intercept point.

DESCRIPTION OF THE PREFERRED EMBODIMENTS

Figure 1:
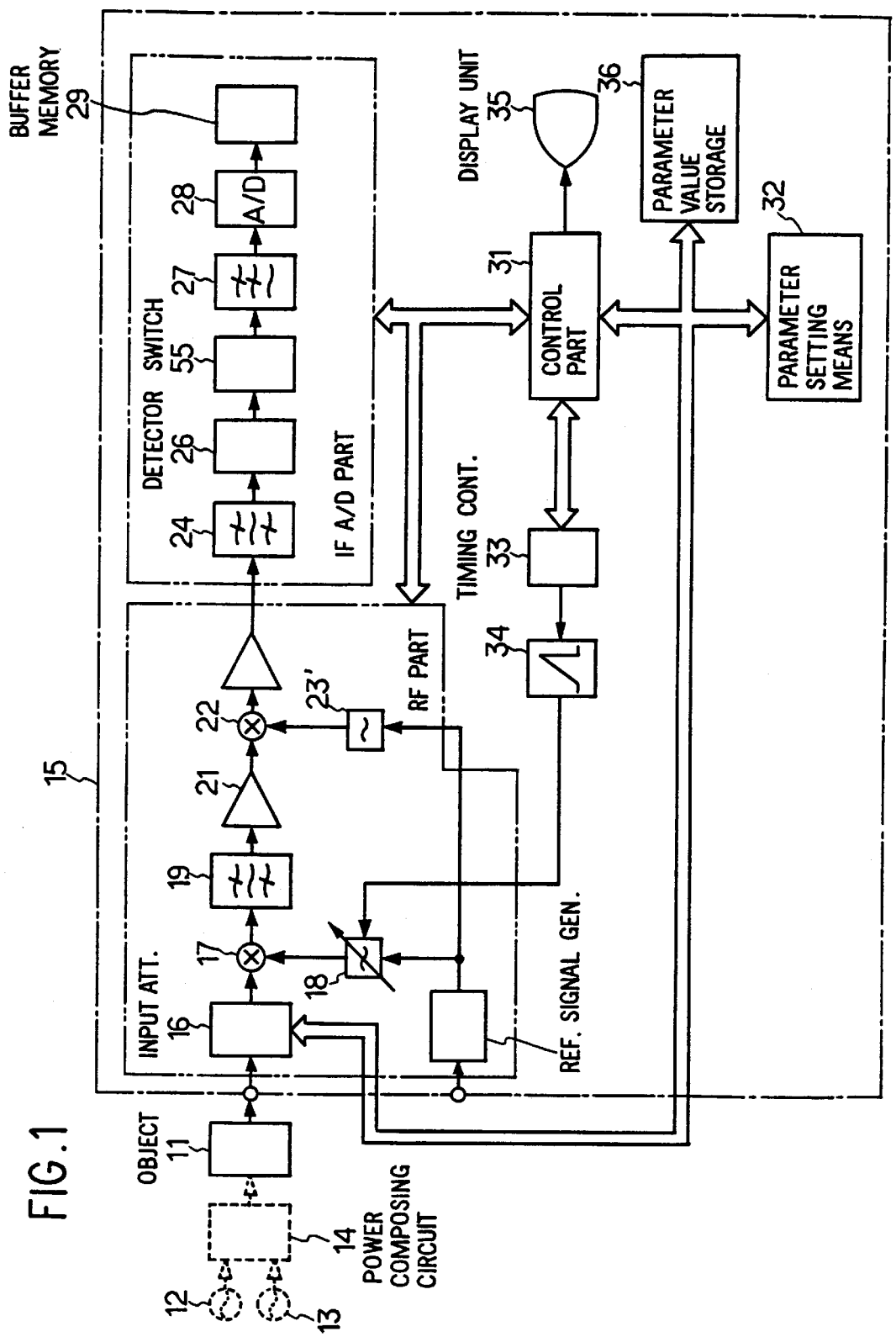
FIG. 1 is a block diagram showing a general configuration example of a spectrum analyzer.
Figure 5A:
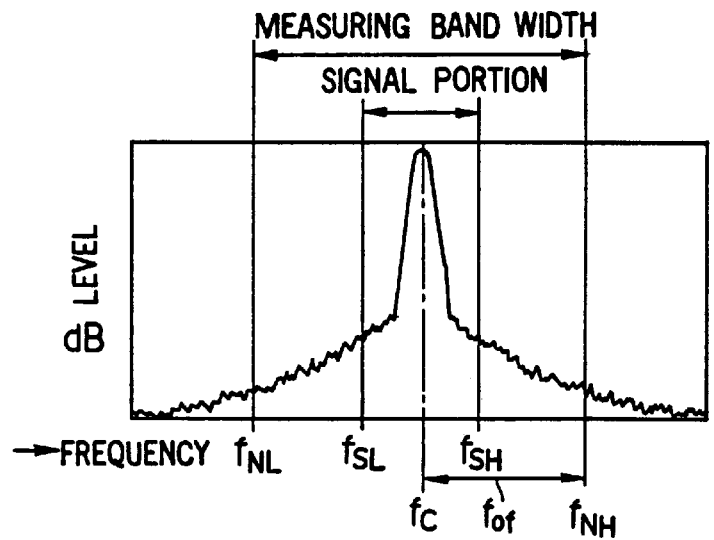
FIG. 5A is a diagram showing a display example of a spectrum wave form in an S/N measurement.

In a measurement by a spectrum analyzer, a parameter for each part such as a band width must be set properly. Therefore, first, an embodiment in which the present invention is applied to an automatic parameter setting for an S/N measurement will be explained. The fundamental hardware configuration is same as that shown in FIG. 1. In an S/N measurement, a wave form in a frequency region shown, for example, in FIG. 5A is displayed on a display screen of a display unit 35 (FIG. 1). In this case, as in a conventional system, a minimum frequency $f_{SL}$ and a maximum frequency $f_{SH}$ of a signal portion to be measured, and a maximum frequency $f_{NH}$ and a minimum frequency $f_{NL}$ of a noise portion are set manually.

Determination of a Central Frequency:

In a spectrum analyzer shown in FIG. 1, the control part 31 reads out spectrum data from the buffer memory 29 and detects a frequency $f_C$ having the largest value in the read data. This frequency is determined as a central frequency. This central frequency $f_C$ is stored in the parameter value storage 36. If a central frequency or a carrier wave frequency of a signal outputted from the object 11 is known, the frequency may be set manually as a central frequency $f_C$. When a central frequency $f_C$ is determined, the input signal is acquired again such that the central frequency is displayed at the center of the display screen and is stored in the buffer memory 29.

Determination of a Frequency Span:

A frequency interval $(f_{NH}-f_C)$ between one end frequency of a noise portion (a frequency band) to be measured, e.g. $f_{NH}$ and a central frequency (a frequency at peak) $f_C$ is already set manually as an offset value $f_{of}$ and a three time value of this offset value, i.e., $3f_{of}$ is defined as a frequency span. This frequency span is stored in the parameter value storage 36.

Figure 6A:
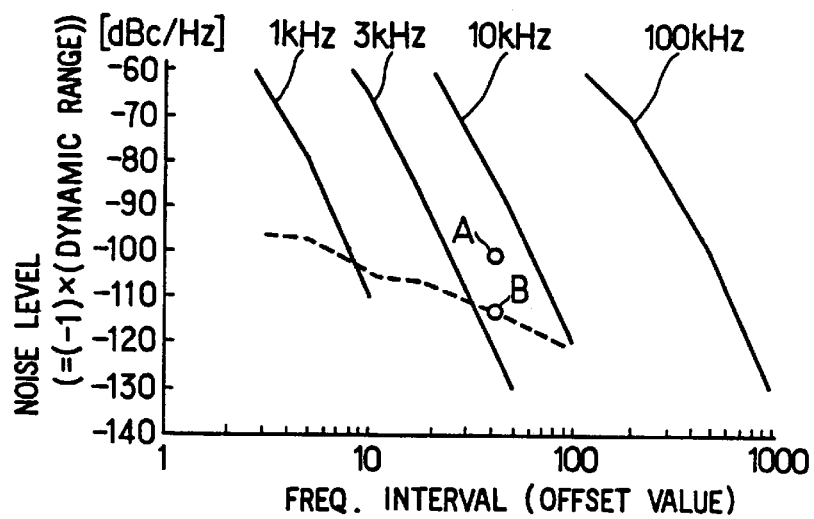
FIG. 6A is a diagram showing a characteristic between a frequency interval of a displayed wave form and a noise level (an input dynamic range), the characteristic having parameters of band widths RBW of a band pass filter.

Determination of RBW:

Determination of a Passing Band Width of Band Pass Filters 19 and 24:

A frequency interval of a wave form to be displayed is an offset value $f_{of}$ and an RBW is determined such that a bottom portion of the spectrum of the signal portion does not influence the noise portion to be measured. This RBW is determined on the spot from FIG. 6A showing relational characteristics having parameters of RBW between a dynamic range and an offset value. That is, FIG. 6A shows a limit in which an object of measurement i.e., a bottom portion of the spectrum of the signal portion, does not overlap with the noise portion due to an influence of the filters 19 and 24. The values on vertical axis indicate noise levels when the peak value of the signal portion is 0 dB. Therefore, an absolute value on the vertical axis is a dynamic range. When a dynamic range and an offset value $f_{of}$ are given, a smaller band width RBW is selected out of the characteristic curves adjacent to the point determined by the dynamic range and the offset value. Incidentally, the number of band widths for selection is predetermined for the spectrum analyzer. For example, when a noise level is −100 dBc/Hz, i.e., a dynamic range is 100, and an offset value $f_{of}$ is 40 kHz, a point A is given in the figure. A band width 3 kHz of the characteristic curve located at left side of the point A in the figure is selected as an RBW. Incidentally, if an RBW is smaller than 3 kHz, a problem of spectrum overlapping does not occur but a frequency sweeping time (measuring time) becomes long. Therefore, a band width curve which is adjacent to the point A and is located at left side of the point A is selected.

Determination of Dynamic Range:

When a dynamic range is large, i.e., a noise level is small, a spurious wave or a distortion is generated by an influence of the frequency mixers 17 and 22 in the spectrum analyzer. Usually, a maximum dynamic range value (a minimum noise level value) limit in which such a distortion or a spurious wave is not generated is obtained in advance through a measurement. This limit is stored in the spectrum analyzer with a margin added. This limit value is indicated, for example, by a dashed line curve in FIG. 6A. The measurable region is the upper region of this dashed line curve in FIG. 6A. For example, when an offset value is 40 kHz, a dynamic range must be smaller than a value 113 dB (point B) on the dashed line curve at 40 kHz. That is, a noise level must be larger than −113 dBc/Hz.

When an RBW is large, a noise level becomes large and a dynamic range becomes small. When a level of noise generated in the spectrum analyzer is $N_S$ and an attenuation amount of the input attenuator 16 is ATT (usually negative value), a noise level NL can be represented by the following formula.

$$NL = N_S + 10\log(RBW) + ATT$$

When the maximum signal level which can be inputted is SL, a measuring limit is SL−NL. This limit line is indicated by a two dot chain line 101 in a noise level—offset value characteristic diagram FIG. 6B. If an absolute value of a dynamic range is larger than the limit, a signal is distorted or a signal peak cannot be displayed within the screen. Therefor, a dynamic range DR is defined as fellows.

$$DR < SL - N_S - 10\log(RBW) - ATT$$

Figure 6B:
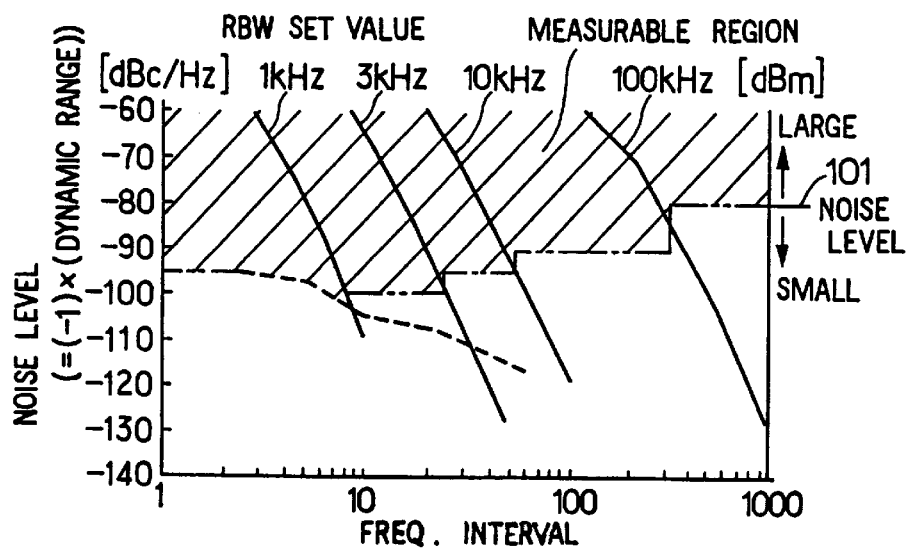
FIG. 6B is a diagram showing a measurable region in the characteristic diagram of FIG. 6A.

From this formula, RBW set values and a dynamic range settable region (the vertical axis represents noise level values which are inverse value of dynamic range) are indicated by slant lines in FIG. 6B. When an internally generated noise level $N_S$ is increased, the limit value is also increased. Therefore, the two dot chain line 101 indicating the noise level limit moves up. When $N_S$ is decreased, the limit value is decreased and the two dot chain line 101 indicating the noise level limit moves down. A dynamic range settable region for offset values $f_{of}$ is indicated by slant lines in FIG. 6B and a dynamic range can be set within the region. When a dynamic range is set within this region, an RBW value is determined on the spot.

The RBW value obtained as mentioned above is also retained in the parameter value storage 36. Incidentally, the characteristics shown in FIG. 6A are stored in the spectrum analyzer in advance.

A limit value of a band width VBW of a low pass filter (a video filter) 27 is represented by VBW=RBW/10 from an experimental law. Further, the input attenuator 16 is controlled to set a reference level such that the maximum peak value accords with an upper end of the display screen. These VBW and reference level are also stored in the parameter value storage 36.

After the various parameters are automatically determined as mentioned above, these parameter values are set in corresponding respective portions by the control part 31. In addition, a sweeping time $T_S$ is determined and set by a calculation of the formula (1) shown in the paragraph BACKGROUND OF THE INVENTION i.e., by a calculation of Frequency Span(Hz)/{RBW(Hz)×min(RBW, VBW)

(Hz)×0.5} (sec). The term min(RBW, VBW) represents a smaller one of RBW and VBW.

After that, an input signal is acquired and stored in the buffer memory 29. Then, a plurality of data between the minimum frequency $f_{SL}$ and the maximum frequency $f_{SH}$ of a signal portion are taken out from the buffer memory 29. Then, all the level values (linear values, i.e., not dB values) are summed and the summed value is divided by the number of data. Assuming that the spectrum of the divided result $G_S$ is uniformly distributed throughout the signal band, the following calculation is performed and a level $L_S$ of the signal portion is obtained.

$$L_S=10 \log G_S + 10 \log((f_{SH}-f_{SL})/(1.2 \times RBW)) + 2.5$$

The reason for the RBW multiplied by 1.2 is a compensation based on a Gaussian characteristic of the band pass filters 19 and 24. The reason of the addition of 2.5 is a compensation of a level decrease due to a logarithmic amplification performed in a previous stage of the detector 26. A plurality of data in a frequency band between the minimum frequency $f_{NL}$ of a noise band and the minimum frequency $f_{SL}$ of a signal portion, and a frequency band between the maximum frequency $f_{SH}$ of the signal portion and the maximum frequency $f_{NH}$ of the noise band, are taken out from the buffer memory 29, and then all the level values (linear values) are summed. The summed data is divided by the number of data. Assuming that the spectrum level of the divided result $G_N$ is uniformly distributed throughout the noise bands, the following calculation is performed and a level $L_N$ of a noise portion is obtained.

$$L_N=10 \log G_N + 10 \log((f_{SL}-f_{NL}+f_{NH}-f_{SH})/(1.2 \times RBW)) + 2.5$$

$L_S/L_N$ is then calculated as a measured S/N and is displayed on the display screen.

Figure 7:
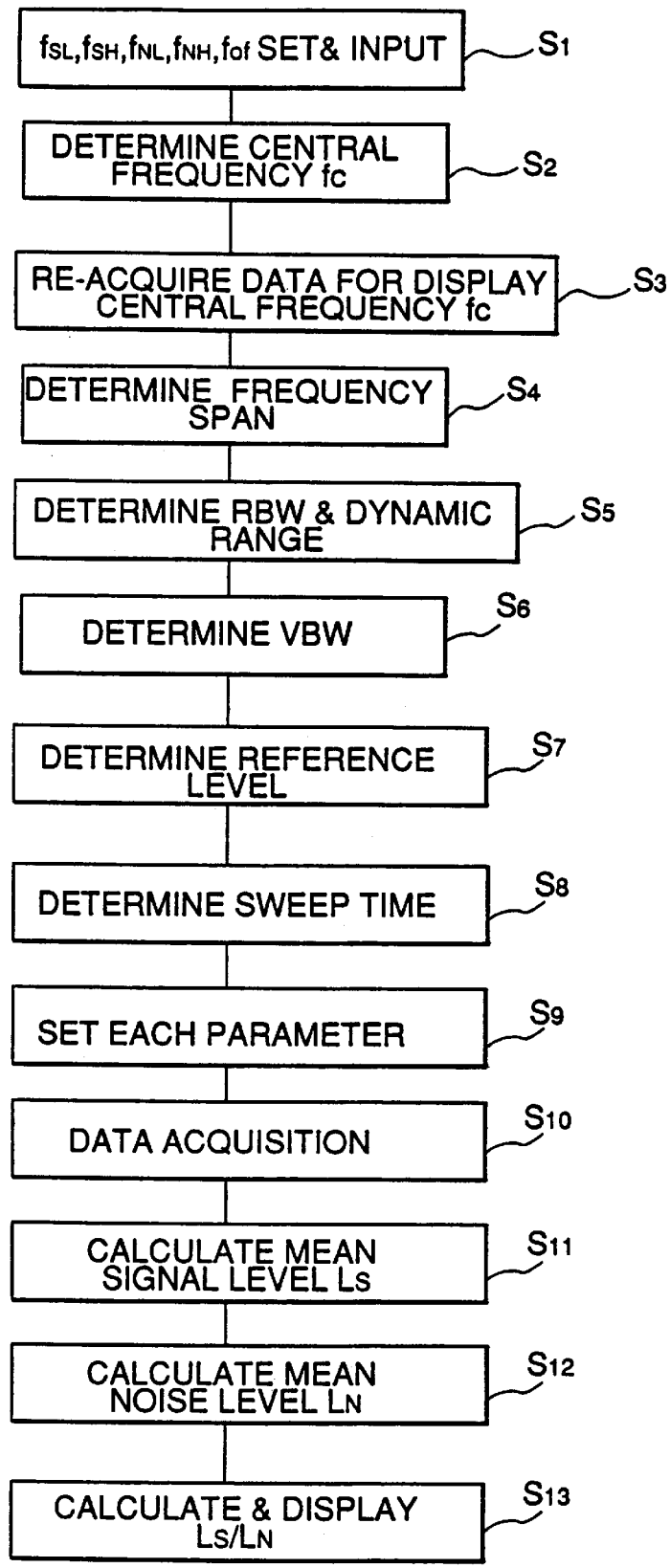
FIG. 7 is a flow chart showing a sequence of an S/N measurement.

FIG. 7 shows a flow chart of the above measuring sequence.

That is, frequencies for defining a signal portion and a noise portion are set and inputted ($S_1$). For this purpose, the following two cases are available, i.e., a manual setting of a carrier wave frequency $f_C$ and a case wherein data are acquired, and then the maximum peak of the data is defined as a carrier wave frequency. Regarding the frequencies for defining a noise portion, $f_{NL}$ and $f_{NH}$ may be automatically determined by inputting a modulation mode. Then $f_C$ is defined as a central frequency of a sweep ($S_2$). Data are acquired again such that the $f_C$ is located at the center of the display screen ($S_3$). A frequency span is defined as, for example, triple of $(f_{NH}-f_C)$ ($S_4$). A band width RBW of the band pass filter and a dynamic range are determined ($S_5$). A band width VBW of the low pass filter is determined ($S_6$). A reference level is determined ($S_7$). A sweeping time is determined ($S_8$). Each of the parameters previously determined is set in a corresponding portion ($S_9$). Data are acquired ($S_{10}$). An average signal level $L_S$ is calculated using the acquired data ($S_{11}$). An average noise level $L_N$ is calculated ($S_{12}$). And then, $L_S/L_N$ is calculated and displayed ($S_{13}$).

An automatic parameter setting is similarly made in the case of an S/N measurement of a burst wave. In this case, in order to acquire only a central frequency component of an input signal, a signal acquisition is performed by fixing the sweep frequency. The acquired signal is read out from the buffer memory 29 to create a trigger signal 51 (FIG. 8B) synchronized with an input burst signal as shown in FIG. 8A. A burst wave form 52 in time region is displayed on the display screen as shown in FIG. 8D utilizing this trigger signal 51. A range 53 to be measured is specified by a marker on the displayed wave form 52. A gate signal 54 is created in accordance with the specified range as shown in FIG. 8C. A switch 55 inserted at latter stage of the detector 26 in FIG. 1 is controlled to on or off and data are acquired during the gate signal 54. A repetition period $T_r$ and a pulse width $T_W$ of this burst signal are known to an operator in advance. The input operation of the frequencies $f_{NL}$ and $f_{NH}$ indicating a measuring band, and the frequencies $f_{SL}$ and $f_{SH}$ indicating a signal portion is the same as that in the S/N measurement of a continuous signal. An automatic setting of various parameters is performed in the same manner as in the S/N measurement of a continuous signal except that the band width VBW of the low pass filter 27 is determined to be $1/T_G$ ($T_G$ is a pulse width of the gate signal 54).

Figure 2A:
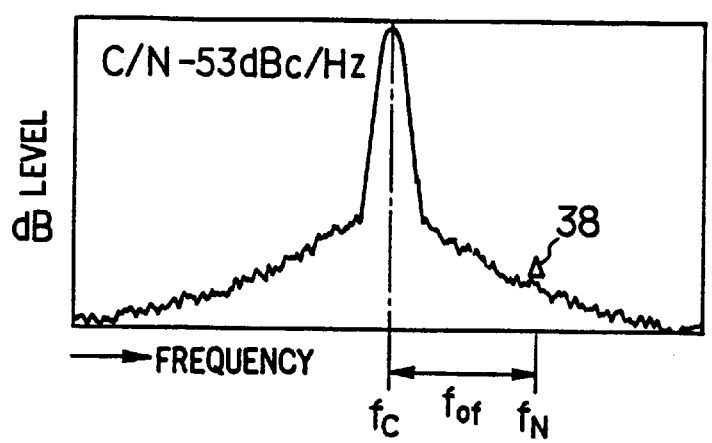
FIG. 2A is a diagram showing a display example of a spectrum wave form in a C/N measurement.
Figure 2B:
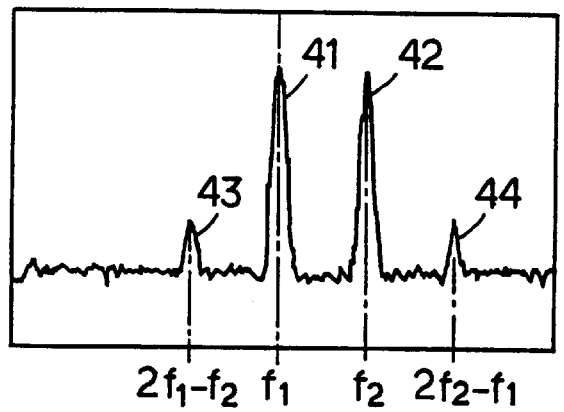
FIG. 2B is a diagram showing a display example of a spectrum wave form in a intermodulation distortion measurement.

Next, a case in which the present invention is applied to so-called C/N measurement, i.e., a ratio of a carrier wave level to a noise level, will be described. In this case, the determination of a central frequency $f_C$ is performed in the same manner as in the S/N measurement case. In this case, when a carrier wave frequency is known, that value may also be inputted manually as a central frequency $f_C$. Further, it is generally prescribed, based on the type of modulation signal to be measured, that a noise level is measured at a noise frequency $f_N$ which is apart from the carrier wave frequency by a certain frequency interval. The frequency interval between the noise frequency $f_N$ at which the noise level is measured and the carrier wave frequency $f_C$ is inputted as an of f set value $f_{of}$. In this case, the two frequencies whose wave forms are to be displayed are the carrier wave frequency $f_C$ and the noise frequency $f_N$ (refer to FIG. 2A).

The frequency span is $3f_{of}$ as in the S/N measurement case. The determination of an RBW, a VBW and a reference level are also performed in the same manner as in the S/N measurement case. The measurement is performed in the sequence described below. Each of the determined parameters is set in the corresponding one of the portions, an input signal is acquired, a data level $L_C$ of the carrier wave frequency $f_C$ and a data level $L_N$ Of the noise frequency $f_N$ (in this example, $f_C + f_{of}$) are taken out from the buffer memory 92, and then a ratio $L_C/L_N$ Of these data levels is displayed on the display screen. The wave form display in frequency region, in this case, is performed as shown in, for example, FIG. 2A.

A C/N measurement of a burst signal can also be performed similarly to the aforementioned S/N measurement of a burst signal by taking out a portion of a burst wave form and by determining the parameters in the similar manner.

Figure 5B:
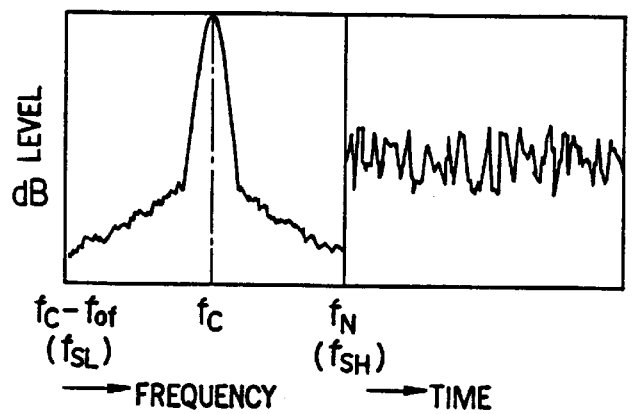
FIG. 5B is a diagram showing a display example in which a spectrum wave form is displayed on a left half portion of a screen and a noise changing state on a time axis is displayed on a right half portion of the screen.

In the C/N measurement, a display on the display screen of the display unit 35 may be made as shown in FIG. 5B. That is, a left half portion of the display screen is defined as a frequency region display area and a right half portion is defined as a time region display area. In the frequency region display area, a carrier wave frequency $f_C$ is located at the center of the area and frequencies apart from the carrier wave frequency by an offset value $f_{of}$ toward higher frequency side and lower frequency side respectively are located at the both ends of the area. Each spectrum between the both end frequencies is displayed. That is, a spectrum wave form is displayed. In the time region display area, a noise level at a frequency $f_N$ which is apart from the carrier wave frequency $f_C$ by an of f set value $f_{of}$ toward higher frequency side is displayed in a time region.

That is, in the spectrum wave form display in the frequency region display area, frequencies of an input signal are swept in the range of at least $f_C \pm f_{of}$ to take out the necessary portions from the data acquired in the buffer memory 29 and then to display them using a horizontal axis as a frequency axis. The data acquired in the buffer memory 29 by fixing an as oscillation frequency of the local oscillator 18 such that the frequency of the acquired signal is $f_N=f_c+f_{of}$ are read out. Each read out data is displayed in the time region display area at a position in vertical axis direction in accordance with a magnitude of the data level. Each data position on the horizontal axis is sequentially shifted to the right. When the horizontal data position reaches the right end of the time region display area, the data position returns to the left end and the display operation is repeated again from the left. The data acquisition and display operation for the frequency region display area and the data acquisition and display operation for the time region display area are alternately performed.

In this case, a C/N measurement is performed by calculating $L_c/L_N$ based on the maximum perk value $L_c$ of the left side spectrum wave form display, i.e., a data value $L_c$ of the central frequency $f_c$ and an average value $L_N$ of noise data in the right side time region display area. And then, the C/N is displayed. Incidentally, in this case, the band width VBW of the low pass filter 27 is set to a value nearly equal to the band width RBW of the band pass filter 19.

A display in the S/N measurement may also be made as shown in FIG. 5B. In this case, a spectrum wave form of a signal portion $f_{SL}-f_{SH}$ is displayed on the left half of the display screen. A particular noise, for example an frequency component $f_{NH}$ only is received and the level change of the frequency component along time passage is displayed on the right half of the display screen as described above. In this case, a frequency span, an RBW and a VBW etc. are determined using a difference value between a frequency $f_c$ having a peak level value of a signal portion $f_{SL}-f_{SH}$ and $f_{NL}$ or $f_{NH}$ as an offset value $f_{of}$ as mentioned above. In this case, a signal level $L_S$ is obtained as in the previous S/N measurement case but a noise level $L_N$ is obtained as described below. That is, all the data level values (linear values) displayed on the right half of the display screen are summed and the summed value is divided by the number of data. Assuming that this divided result $G_{N1}$ of the noise level is uniformly distributed throughout the noise portion, a noise level $L_N$ is obtained by a formula below.

$$L_N=10 \log G_{N1}+10 \log((f_{SL}-f_{NL}+f_{NH}-f_{SH})/RBW)+2.5$$

The measured S/N is obtained by calculating $L_S/L_N$ based on the $L_N$ obtained from the above formula and the aforementioned $L_S$.

That is, when $L_S$ and $L_N$ are measured displaying a spectrum wave form as shown in FIG. 5A, if the RBW is large and the VBW is also large, a measurement error of the noise portion becomes large. Therefore, it is desired that the measurement is performed using a VBW value selected as small as possible. Consequently, the VBW is set to VBW=RBW/10. However, when an $L_N$ is measured in time region by displaying as shown in FIG. 5B, since noise averaging is made enough, the VBW may not be a small value. Therefore, it is better to select the VBW value as large as possible and to make the measuring time short. From this point, VBW is selected to be VBW=RBW.

Figure 8:
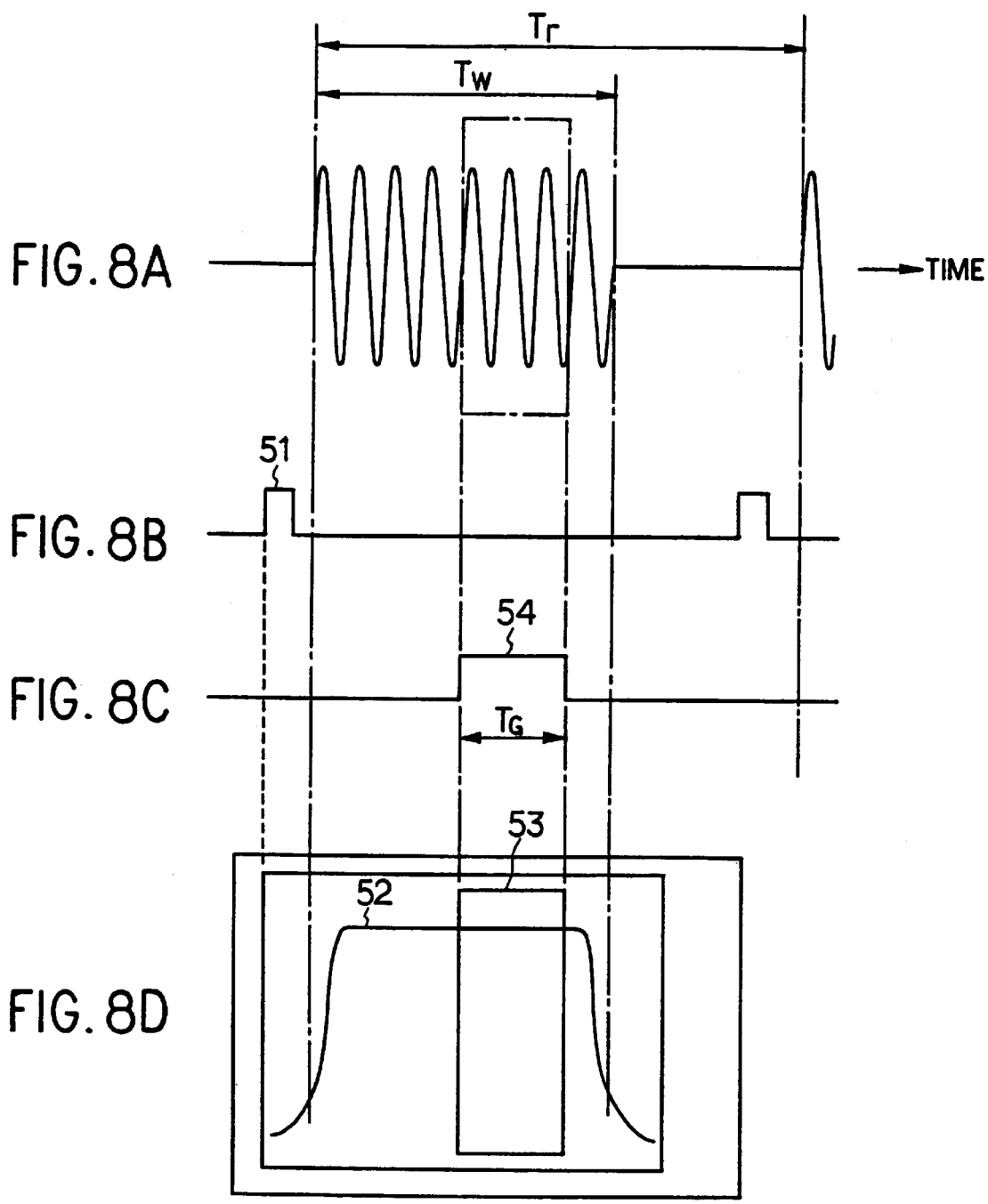
FIG. 8A is a diagram showing an example of a burst wave input.
FIG. 8B is a diagram showing a trigger synchronized with a burst wave.
FIG. 8C is a diagram showing a gate signal for signal acquisition.
FIG. 8D is a diagram showing an example of a burst wave on a display screen and an example of a signal acquisition range.

Next, a measuring method of a intermodulation distortion according to the present invention will be explained referring to FIG. 8. The same hardware configuration as shown in FIG. 1 can also be used in this case.

Figure 9:
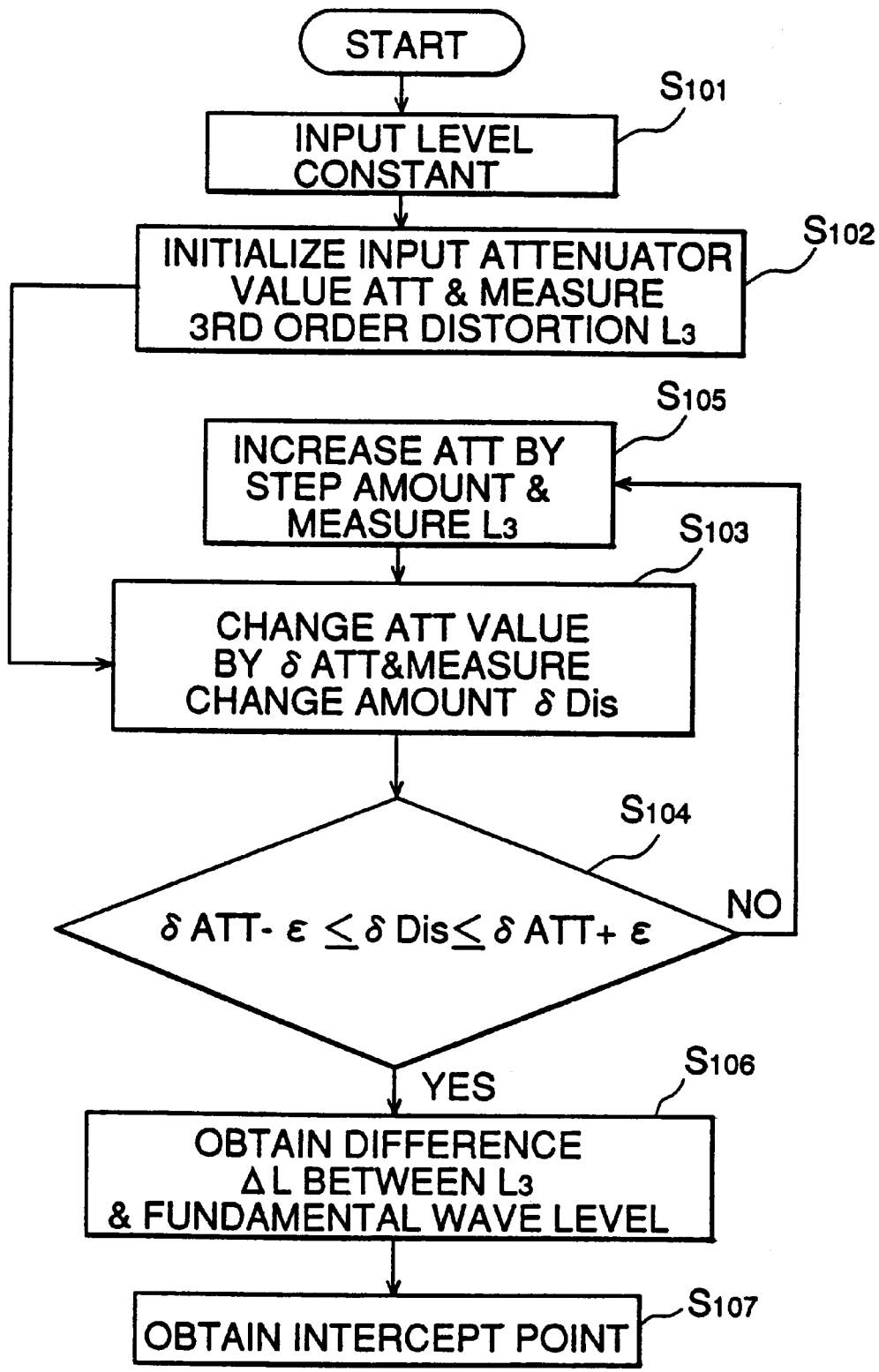
FIG. 9 is a flow chart showing a control sequence of an input attenuation amount for obtaining an intercept point.

In this embodiment, as shown in FIG. 9, a signal level inputted to the spectrum analyzer is fixed to, for example, $L_V$ ($S_{101}$). An attenuation amount of the input attenuator 16 is set to an initial value, generally 0 dB (no attenuation), and a third order distortion amount $L_3$ at that time is measured ($S_{102}$). Then, the attenuation amount of the input attenuator 16 is changed by an infinitesimal step amount δATT, for example, 1 dB, which is small enough against a predetermined step amount (to be explained later) and a third order distortion amount $L_3'$ at that time is measured. Then, an amount change from the measured amount $L_3$ in step $S_{102}$, i.e., a third order distortion amount change $\delta D_{is}=L_3-L_3'$ is obtained ($S_{103}$). The input attenuator 16 is built such that the attenuation amount can be changed by 1 dB.

Figure 3A:
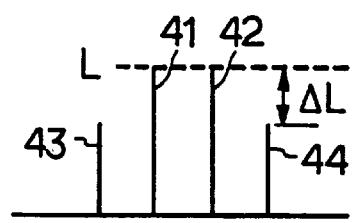
FIG. 3A is a diagram showing a relationship between a fundamental wave level and a third order distortion level.
Figure 3B:
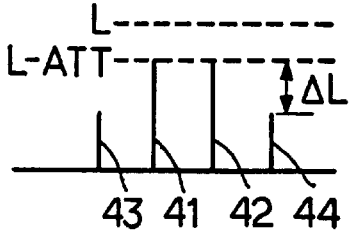
FIG. 3B is a diagram showing a relationship between the levels when an input attenuation amount is increased by ATT from the state of FIG. 3A.
Figure 4A:
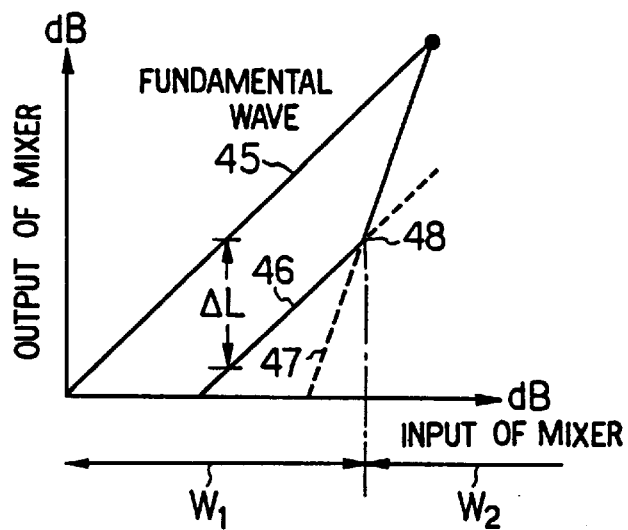
FIG. 4A is a diagram showing an input/output characteristic of a frequency mixer for a fundamental wave and a third order distortion.
Figure 4B:
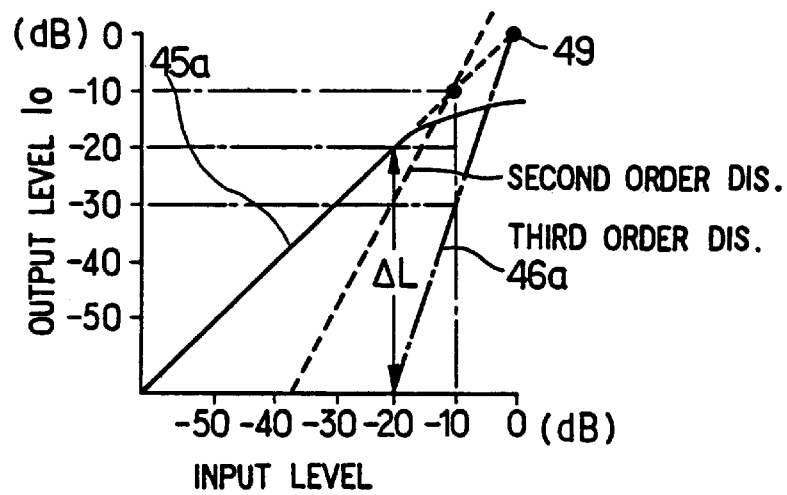
FIG. 4B is a diagram for explaining an intercept point.

A check is made to see if the third order distortion amount change $\delta D_{is}$ is between δATT−ϵ and δATT+ϵ ($S_{104}$) (ϵ is, for example, approximately 0.2–0.3 dB). If the third order distortion amount change is not in the above range, then the process moves to step $S_{105}$ and the attenuation amount of the input attenuator 16 is increased by a predetermined step amount, for example, 10 dB. Then, the third order distortion amount $L_3$ at that time is measured and the process returns to step $S_{103}$ to perform the same operation. If, in step $S_{104}$, $\delta D_{is}$ is within δATT±ϵ, the third order distortion amounts $L_3$ and $L_3'$ indicate that the third order distortions 43 and 44 (FIG. 3) in the input signal are dominant. Therefore, a level $L_1'$ of the fundamental waves 41 and 42 at that time is measured and a level difference between the level $L_1'$ and the third order distortion amount $L_3'$ at that time, i.e., $\Delta L=L_1'-L_3'$, 'is obtained ($S_{106}$).

Then, an intercept point is obtained from the fundamental wave level $L_1'$ and the level difference $\Delta L$ by the formula below ($S_{107}$).

$$(L_1'+(\Delta L/2), L_1'+(\Delta L/2))$$

The parameter setting for an automatic measurement of a intermodulation distortion is performed in the same manner as mentioned above. When each frequency of the fundamental waves 41 and 42 of the input signal is known, these frequencies $f_1$ and $f_2$ are inputted and set manually. When the fundamental wave frequencies are not known, or actually inputted fundamental wave frequencies are shifted from the known values even if the fundamental wave frequencies are known, the input signal is stored once in the buffer memory 29 and two frequencies having the maximum level are searched in the data series of the input signal. Then, those frequencies are defined as $f_1$ and $f_2$ ($f_1<f_2$). The central frequency $f_c=(f_1+f_2)/2$ is calculated from these frequencies. This $f_c$ is then stored in the parameter value storage 36.

Then, a frequency span is determined. In the case of third order distortion, a frequency span is normally set to triple of the fundamental wave frequency difference $f_2-f_1$ so that both third order distortions 43 and 44 can be displayed within the display screen area. However, since it is desired that the entire bottom portion of the third order distortions 43 and 44 is displayed on the screen, the frequency span is set to five time value of ($f_2-f_1$). This, frequency span is also stored in the parameter value storage 36.

Then, a passing band width RBW of the band pass filters 19 and 24 is determined. An RBW is determined such that each spectrum of the fundamental waves 41, 42 and the third order distortions 43, 44, for example a bottom portion of the signal 41, does not influence the peak of the adjacent spectrums, the signals 42 and 43 in the signal 41 case. The RBW is determined on the spot in the same manner as mentioned above from FIG. 6 showing a relational characteristic between a dynamic range and a frequency interval of adjacent carrier waves ($f_2-f_1$) (offset frequency $f_{of}$).

The process after that is the same as in the S/N measurement case.

After the various parameters are determined, in step $S_{102}$ of FIG. 9. each of the parameters such as a display central frequency $f_c$, a frequency span, an RBW, a VBW and a reference level etc. is set in the corresponding one of the portions by a control of the control part 31. Further, a sweeping time $T_s$ is obtained from a calculation of the formula Frequency Span (Hz)/{RBW(Hz)×min(RBW, VBW) (Hz)×0.51} (sec) and is set. The term min(RBW, VBW) represents a smaller one of RBW and VBW. Then, the process of step $S_{103}$ and the following steps in FIG. 9 are performed. Each measurement associated with the this process is performed by acquiring, each time, the necessary data into the buffer memory 29.

The present invention can be applied to a measurement of a fifth order distortion or a seventh order distortion etc. Regarding a fifth order distortion and a seventh order distortion, the levels of these distortions change five and seven times of the input signal level change respectively. For the measurement of these signals by a spectrum analyzer, a frequency span of the spectrum analyzer may be set to seven times and nine times of the fundamental wave frequency difference $f_2-f_1$. Intercept points are $(l_o+(\Delta L/4), l_p+(\Delta L/4))$ and $(l_o+(\Delta L/6), l_p+(\Delta L/6))$ respectively, where $l_o=l_p$.

Figure 10:
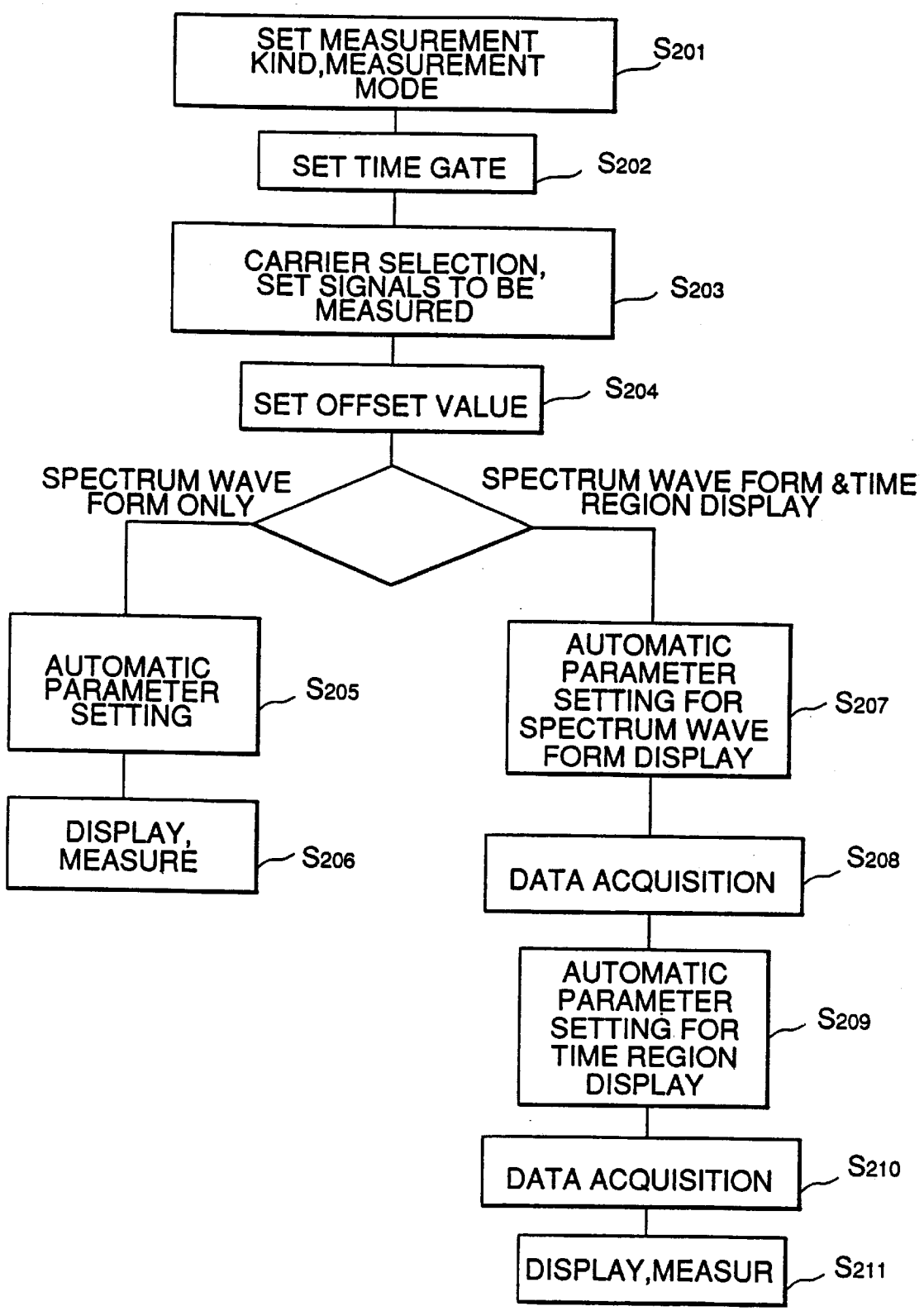
FIG. 10 is an overall flow chart of a measuring method by a spectrum analyzer.

In the measurement by a spectrum analyzer, as shown in FIG. 10, a setting of a measurement kind such as an S/N measurement, a C/N measurement or a intermodulation distortion measurement, and a setting of a mode such as a continuous wave measurement or a burst wave measurement, are performed first ($S_{201}$) When a burst wave is measured, a time gate for acquiring data is set ($S_{202}$) For continuous wave measurement, a time gate is not set. Then, a carrier wave frequency, a modulation mode or each frequency to be measured are set ($S_{203}$). Further, an offset frequency $f_{of}$, i.e., two frequencies of a display wave form, is set ($S_{204}$). Then, the process branches into two paths depending on the display mode i.e., displaying only spectrum wave form on the entire display screen or displaying a spectrum wave form and a time region display side by side. When only spectrum wave form is displayed, the parameters such as an RBW, a VBW, a central frequency $f_c$, a reference level and a frequency span etc. are determined and the determined parameters are set in the respective portions ($S_{205}$). That is, steps $S_2$–$S_9$ in FIG. 7 are performed. Then, a data acquisition, a measurement calculation and a display operation are performed ($S_{206}$) When both spectrum wave form and time region display are performed, the parameters for a spectrum wave form display such as an RBW, a VBW, a central frequency $f_c$, a frequency span and a reference level etc. are determined and the determined parameters are set in the respective portions ($S_{207}$). Then, a data acquisition is performed based on this setting ($S_{208}$). Next, the parameters for time region display such as a central frequency, a frequency span, an RBW, a VBW and a reference level etc. are determined and the determined parameters are set in the respective portions ($S_{209}$). In this case, the central frequency is $f_c+f_{of}$ (noise frequency to be measured) and the frequency span is zero (no sweeping). Based on this setting, a data acquisition is performed ($S_{210}$). The data acquired in steps $S_{208}$ and $S_{210}$ are displayed respectively in a spectrum wave form and a time region display and are used for the measurement calculation ($S_{211}$).

As mentioned above, according to the present invention, various parameters of the spectrum analyzer are set automatically. Particularly, an RBW is determined automatically. Therefore, comparing with a conventional case in which those parameters are determined in trial and error, the determination can be done in a short time and a user does not need to perform troublesome operations. In addition, an S/N measurement dan be performed using a spectrum analyzer.

In addition, according to the present invention, a noise measurement and a noise display are carried out in a time region, the noise data are summed and averaged. Therefore, the noise level change along the time passage can be observed well and the average noise level can be understood intuitively. As in a conventional system, it is not necessary to integrate the signal in the low pass filter 27 so that the displayed noise level is not fluctuated. Further, the band width VBW of the low pass filter 27 can be made equal to an RBW and thus, the measuring time (sweeping time) is significantly reduced to, for example, one tenth of the conventional case.

Further, according to the present invention, when an input attenuation amount is changed by an infinitesimal value, and the intermodulation distortion amount difference between the intermodulation distortion value before the attenuation amount change and the intermodulation distortion value after the attenuation amount change is substantially zero, the intermodulation distortion amount at that time is acquired. Therefore, even a relatively small intermodulation distortion amount can be detected surely. Accordingly an intercept point can be obtained even if a intermodulation distortion amount is small.

Further, a proper RBW can be set automatically. A work load for repeating the RBW setting in trial and error until four peaks clearly appear can be eliminated, and thus the measurement can be carried out in a short time.

What is claimed is:

1. A measuring device using a spectrum analyzer comprising:

a display screen controlled by a processor on which a spectrum of an input signal is displayed in a frequency region on a half portion of said display screen and a noise level at a frequency associated with said input signal is displayed in a time region on another half portion of said display screen, wherein said processor alternately obtains a mean carrier value $L_C$ of a carrier wave portion of the input signal in said spectrum and a mean noise value $L_N$ of data in said time region display, and calculates a C/N value based on $L_C/L_N$.

2. A measuring device using a spectrum analyzer comprising:

a display screen controlled by a processor on which a spectrum of an input signal is displayed in a frequency region on a half portion of said display screen and a noise level at a frequency associated with said input signal is displayed in a time region on another half portion of said display screen, wherein said processor alternately obtains a first mean value from data of a signal portion in said spectrum display and then obtains a signal level $L_S$ assuming that the first mean value is uniformly distributed throughout a band of the signal portion, on one hand, and obtains a second mean value from data in said time region display and then obtains a noise level $L_N$ assuming that the second mean value is uniformly distributed throughout a band of a noise portion in said input signal, on the other hand, and calculates an S/N value based on $L_S/L_N$.

* * * * *